(12) United States Patent
Kapelke et al.

(10) Patent No.: US 12,738,858 B2
(45) Date of Patent: Sep. 15, 2026

(54) DEVICE FOR CONVERTING ELECTRICAL ENERGY INTO HEAT IN THE FIELD OF MEDIUM- AND HIGH-VOLTAGE ENGINEERING AND CONVERTER ARRANGEMENT HAVING THE DEVICE

(71) Applicant: Siemens Energy Global GmbH & Co. KG, Munich (DE)

(72) Inventors: Martin Kapelke, Nuremberg (DE); Christian Schrammel, Schwarzenbruck (DE); Ingo Euler, Erlangen (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 200 days.

(21) Appl. No.: 18/675,392

(22) Filed: May 28, 2024

(65) Prior Publication Data

US 2024/0396467 A1 Nov. 28, 2024

(30) Foreign Application Priority Data

May 25, 2023 (EP) .................................... 23175412

(51) Int. Cl.
*H02M 7/00* (2006.01)
*H02M 3/00* (2006.01)
(Continued)

(52) U.S. Cl.
CPC ......... *H02M 7/003* (2013.01); *H02M 7/4835* (2021.05); *H05K 7/209* (2013.01); *H02M 3/003* (2021.05)

(58) Field of Classification Search
None
See application file for complete search history.

(56) References Cited

U.S. PATENT DOCUMENTS 5,124,872 A * 6/1992 Pham ................... H01H 33/161 361/13
5,986,906 A * 11/1999 Ramezani ............... H02M 1/34 363/136

(Continued)

FOREIGN PATENT DOCUMENTS

CN 102882440 A 1/2013
CN 211701835 U 10/2020

(Continued)

OTHER PUBLICATIONS

Yerasimou Yerasimos et al: "Thermal Management System for Press-Pack IGBT Based on Liquid Metal Coolant", IEEE Transactions On Components, Packaging and Manufacturing Technology, IEEE, USA, Bd. 10, Nr. 11, Jul. 20, 2020 (Jul. 20, 2020), Seiten 1849-1860, XP011820484; 2020.

(Continued)

*Primary Examiner* — Gustavo A Rosario-Benitez
(74) *Attorney, Agent, or Firm* — Laurence A. Greenberg; Werner H. Stemer; Ralph E. Locher

(57) ABSTRACT

A device converts electrical energy into heat with a conversion module. The conversion module contains a first resistor assembly connected to a first connection terminal and has a plurality of resistor disks, and a first semiconductor switch being used to block or allow a flow of current through the first resistor assembly. The conversion module further has a second resistor assembly connected to the first connection terminal and has a plurality of resistor disks, and a second semiconductor switch being used to block or allow a flow of current through the second resistor assembly. The resistor disks of the first and of the second resistor assembly are arranged in a first stack between first and second cooling plates. The first stack has a middle cooling plate which
(Continued)

separates the resistor disks of the first resistor assembly from the resistor disks of the second resistor assembly.

9 Claims, 4 Drawing Sheets

(51) Int. Cl.
*H02M 7/483* (2007.01)
*H05K 7/20* (2006.01)

(56) References Cited

U.S. PATENT DOCUMENTS

| | | | | |
|---|---|---|---|---|
| 6,094,129 | A * | 7/2000 | Baiatu | H01C 7/02 338/53 |
| 8,610,384 | B2 | 12/2013 | Dommaschk et al. | |
| 11,211,878 | B2 * | 12/2021 | Biris | H02M 1/32 |
| 2002/0126403 | A1 * | 9/2002 | Lim | G11B 5/012 360/25 |
| 2011/0163702 | A1 * | 7/2011 | Dommaschk | H02P 3/22 318/376 |
| 2016/0211741 | A1 * | 7/2016 | Ishino | H02M 1/34 |
| 2018/0233896 | A1 * | 8/2018 | Boehme | H02H 3/10 |
| 2021/0008983 | A1 * | 1/2021 | Wind | H02H 9/001 |
| 2023/0198259 | A1 * | 6/2023 | Pieschel | H02J 3/0014 363/44 |

FOREIGN PATENT DOCUMENTS

| | | | |
|---|---|---|---|
| DE | 102008045247 | A1 | 3/2010 |
| EP | 2325881 | A1 | 5/2011 |
| WO | WO 2010023127 | A2 | 3/2010 |
| WO | WO 2016170910 | A1 | 10/2016 |

OTHER PUBLICATIONS

Giannini G et al: “Dual stage converters for multi-system high power locos. Architecture of loco E403”, Power Electronics, Electrical Drives, Automation and Motion, 2006. SPE EDAM 2006. International Symposium on Taormina, Italy May, 23-26, 2006, Piscataway, NJ, USA,IEEE, May 1, 2006 (May 1, 2006), Seiten 1078-1083, XP010924648; 2006;.

* cited by examiner 1
7
FD
10
FD
4
X2
8
11
E
5
3
X1
2
6
12
FD
9
FD 25
24
22
20
23
21
Power Module
PM / C [4]
Resistor Assembly
R [4]
Resistor Assembly
R [3]
Power Module
PM / C [3]
Power Module
PM / C [2]
Resistor Assembly
R [2]
27,28
R [1]
Resistor Assembly
26
Power Module
PM / C [1]

61
60
59
58
57
56
55
54
45
44
43
42
41
40
39
35
48
47
46
49
50
51
52
53
7
36
RS1
RS2
RS3
38
RS4
RS5
RS6
37
10
33
34
31
32
12

DEVICE FOR CONVERTING ELECTRICAL ENERGY INTO HEAT IN THE FIELD OF MEDIUM- AND HIGH-VOLTAGE ENGINEERING AND CONVERTER ARRANGEMENT HAVING THE DEVICE

CROSS-REFERENCE TO RELATED APPLICATION

This application claims the priority, under 35 U.S.C. § 119, of European Patent Application EP 23175412.8, filed May 25, 2023; the prior application is herewith incorporated by reference in its entirety.

FIELD AND BACKGROUND OF THE INVENTION

The invention relates to a device for converting electrical energy into heat in the field of medium and high-voltage engineering with a first conversion module. The device contains a first resistor assembly which is connected to a first connection terminal of the conversion module and has a plurality of resistor disks, and a first semiconductor switch which can be used to block or allow a flow of current through the first resistor assembly and which is connected to a second connection terminal of the conversion module.

In most applications, a device of this kind has the object of removing surplus electrical energy in a transmission network, in particular by converting the electrical energy into heat. This can contribute toward stabilizing the transmission network in the event the surplus energy cannot be transmitted into a neighboring network, stored in an energy store or consumed by a load.

A device mentioned at the beginning is known from international patent disclosure WO 2010/023127 A2. The known device has conversion modules which are able to be switched or are switched during operation in a series connection between two DC voltage poles of an HVDC transmission link. A conversion module of the known device is shown in FIG. 1. It contains a first connection terminal X1 and a second connection terminal X2 and a first diode D1 between the connection terminals. Arranged in a resistor assembly branch are a resistor assembly R1 and a semiconductor switch S1 which is connected to the first connection terminal X1 via a second diode D2. An energy store (capacitor) C is arranged in a parallel connection with the resistor assembly branch. Each conversion module forms an independent unit for thermal energy conversion which controls the power consumption of the device (which is also referred to as a DC chopper) via a central controller substantially independently of the other conversion modules connected in series. The controller switches on the semiconductor switches (realized as IGBTs in the example shown) contained in the power module, as a result of which a current path leads through resistors. The thermal energy conversion takes place by way of the voltage present there.

SUMMARY OF THE INVENTION

The object of the invention is to propose a device of this kind which is as effective as possible in energy conversion, reliable and easy to maintain.

In the case of a device of this type, the object is achieved according to the invention in that the device further contains a second resistor assembly which is connected to the first connection terminal of the conversion module and has a plurality of resistor disks, and a second semiconductor switch which can be used to block or allow a flow of current through the second resistor assembly and which is connected to the second connection terminal of the conversion module. The resistor disks of the first and of the second resistor assembly are arranged in a common stack between a first and a second cooling plate, which stack is referred to as the first stack below. The first stack further has a middle cooling plate which separates the resistor disks of the first resistor assembly from the resistor disks of the second resistor assembly. The first cooling plate is electrically connected to the first semiconductor switch. The second cooling plate is electrically connected to the second semiconductor switch and the middle cooling plate is electrically connected to the first connection terminal of the conversion module. A conversion module accordingly contains two (or more) resistor assemblies in two resistor assembly branches which are arranged in parallel with one another. In this way, the amount of converted energy can be advantageously increased (this is above 1 MJ in most cases). Furthermore, the two resistor assemblies are arranged together in one stack between cooling plates. The cooling plates can be actively cooled such that the temperature of the resistor assemblies can be advantageously lowered and the latter are more efficient during the energy conversion. The cooling plates can additionally be used as connections of the resistor assemblies. This simplifies the design of the device and makes the maintenance thereof easier. The heat transfers and the cooling system can be designed such that the heat dissipation takes place over a period of time of below 60 or even of below 40 minutes until the worst cooled resistor disks have dissipated at least 90% or 95% of the consumed energy again.

According to one embodiment of the invention, the first and the second resistor assembly each contain further resistor disks, wherein the further resistor disks of the first and of the second resistor assembly are arranged in a common second stack between the first and the second cooling plate. The middle cooling plate separates the further resistor disks of the first resistor assembly from the further resistor disks of the second resistor assembly. According to this embodiment, the second stack is arranged parallel to the first stack. The resistor assemblies accordingly consist of two (or more) stacks of a plurality of series-connected resistor disks, which stacks are arranged parallel to one another, as a result of which a higher power consumption is made possible by the device.

Expediently, a first diode is connected in parallel with the first resistor assembly and a second diode is connected in parallel with the second resistor assembly. A flow of current counter to the forward direction of the semiconductor switch assigned to the respective resistor assembly (this is a residual current in most cases) therefore takes place via the first or second diode, respectively.

Some or else all of the resistor disks can be in the form of cylindrical ceramic-carbon resistor disks. The volume of the resistor disks and the maximum permissible temperature and thermal capacity thereof generally determine the energy consumption amount of a resistor assembly. For example, 4 parallel stacks of 4 resistor disks each can allow an energy turnover of more than 2 MJ.

Appropriately, the first and/or the second stack have at most ten resistor disks in each case. Although on the one hand a smaller number of resistor disks used per stack reduces the energy turnover, on the other hand the stack can be better or more quickly cooled in this way and so the device can operate more effectively.

According to one embodiment of the invention, the first, the second and the middle cooling plate are connected to a common cooling circuit. The cooling plates can be manufactured at least from aluminum. Expediently, the resistor assembly is enclosed at the top and bottom by aluminum cooling plates. The latter are flown through by water and connected to a cooling system. They can be connected hydraulically in series or in parallel (e.g. one below the other). Appropriately, they form electrical connection points of the resistor assembly. The sides of the resistor assembly can be enclosed by plates made of glass-fiber-reinforced plastic. The heat dissipation of the resistor disks takes place via the cooling plates to the cooling system and/or via natural convection to the ambient air. Moreover, the aluminum cooling plates can be connected via plastic tubes to distribution pipes for supply and return.

The first and the second semiconductor switch can each be semiconductor switches which are able to be switched off, for example IGBTs, IGCTs or other appropriate semiconductor switches.

Preferably, the first conversion module further contains an energy store which is arranged in a parallel connection with the first semiconductor switch and the first resistor assembly. The energy store can be used to generate a defined voltage (appropriately the energy store voltage) across the connection terminals of the conversion module.

According to one embodiment of the invention, the device further contains a second conversion module which is electrically connected in series with the first conversion module. The first and the second conversion module are arranged in one level of a carrying structure. The second conversion module contains a third resistor assembly and a fourth resistor assembly. The third resistor assembly is arranged above and electrically insulated from the first resistor assembly in the carrying structure and the fourth resistor assembly is arranged above and electrically insulated from the second resistor assembly in the carrying structure. In particular, the third and the fourth resistor assembly can be arranged above the first and the second resistor assembly in the carrying structure. According to this embodiment, a particularly effective arrangement of the components of the device is provided. Resistor assemblies which are assigned to two different conversion modules are arranged below one another in a common installation space within the carrying structure. In this way, the accessibility of the connections (conductors, busbars, optical waveguides) and tubes of the cooling system can advantageously be improved such that the mounting and the maintenance of the device is further facilitated.

The invention further relates to a converter arrangement which contains a converter having an AC voltage side for connecting to an AC voltage grid and a DC voltage side.

The object of the invention is to specify a converter arrangement of this kind which allows voltage conversion and energy transmission which are as reliable as possible.

In the case of a converter arrangement of this type, the object is achieved according to the invention in that the converter arrangement further contains a device according to the invention for converting electrical energy into heat and which is connected to the DC voltage side of the converter.

The advantages of the converter arrangement according to the invention emerge in particular from the advantages which have already been described in connection with the device according to the invention.

In one application of the converter arrangement, the AC side of the converter can be connected to an energy generation installation. The energy generation installation can, for example, be a wind farm, in particular an offshore wind farm. The converter has the object of feeding energy generated in the wind farm into a high-voltage DC (HVDC) transmission link and of transmitting the energy into a supply network by means of the HVDC transmission link (and a further converter). The device connected to the converter can be advantageously used to effectively convert surplus energy (in the event of a surplus production in the wind farm) which cannot be fed into the supply network into heat.

Other features which are considered as characteristic for the invention are set forth in the appended claims.

Although the invention is illustrated and described herein as embodied in a device for converting electrical energy into heat in the field of medium and high-voltage engineering and converter arrangement having the device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figures 1, 2:
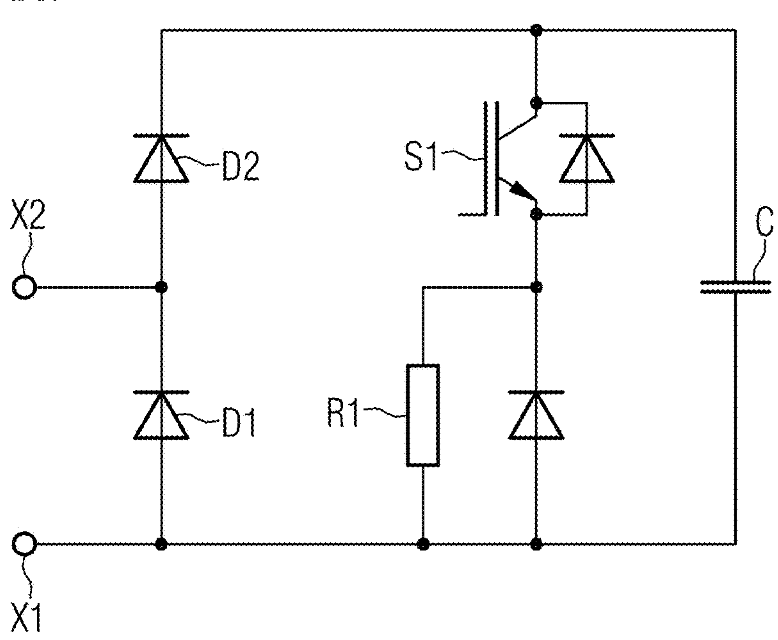
FIG. 1 is a schematic illustration of a conversion module according to the prior art.
FIG. 2 is a schematic illustration of an exemplary embodiment of a device according to the invention.

Referring now to the figures of the drawings in detail and first, particularly to FIG. 2 thereof, there is shown a conversion module 1 which together with other identically designed conversion modules forms a device V for converting electrical energy into heat. Like the conversion module of FIG. 1, the conversion module 1 contains two connection terminals X1, X2 which are configured to switch the conversion module 1, in a series connection with further conversion modules to form the device V, between the DC voltage poles of a DC voltage link. Connected between the connection terminals X1, X2 is a bridge branch in which a first diode 2 is arranged. A bypass switch 3 is additionally arranged in parallel with the first diode 2 between the connection terminals X1, X2, which bypass switch can be used to bypass the conversion module 1 in the event of a fault for example.

The conversion module 1 further has a second diode 4 and an energy store 5 (a capacitor in the example illustrated). A discharge resistor E for discharging the energy store 5 is arranged in parallel with the energy store 5.

Moreover, the conversion module 1 contains a first resistor assembly 6 which is connected to the first connection terminal X1 of the conversion module 1 and has a plurality of resistor disks, and a first semiconductor switch 7 which can be used to block or allow a flow of current through the first resistor assembly 6 and which is connected to a second connection terminal X2 of the conversion module. The first semiconductor switch 7 and the first resistor assembly 6 are arranged in a first switch branch 8 which is connected in parallel with the energy store 5. At the same time, the conversion module 1 contains a second resistor assembly 9 which is connected to the first connection terminal X1 of the conversion module 1 and has a plurality of resistor disks, and a second semiconductor switch 10 which can be used to block or allow a flow of current through the second resistor assembly 9 and which is connected to a second connection terminal X2 of the conversion module 1. The second semiconductor switch 10 and the second resistor assembly 9 are arranged in a second switch branch 11 which, just like the first switch branch 8, is connected in parallel with the energy store 5. The semiconductor switches 7, 10 and the resistor assemblies 6, 9 each have their own freewheeling diode FD connected in (anti) parallel therewith. Activating the semiconductor switches 7, 10 allows a flow of current through the assigned resistor assemblies 6, 9, as a result of which electrical energy is converted into heat and is dissipated to the surroundings by means of active cooling and/or convection.

Figure 3:
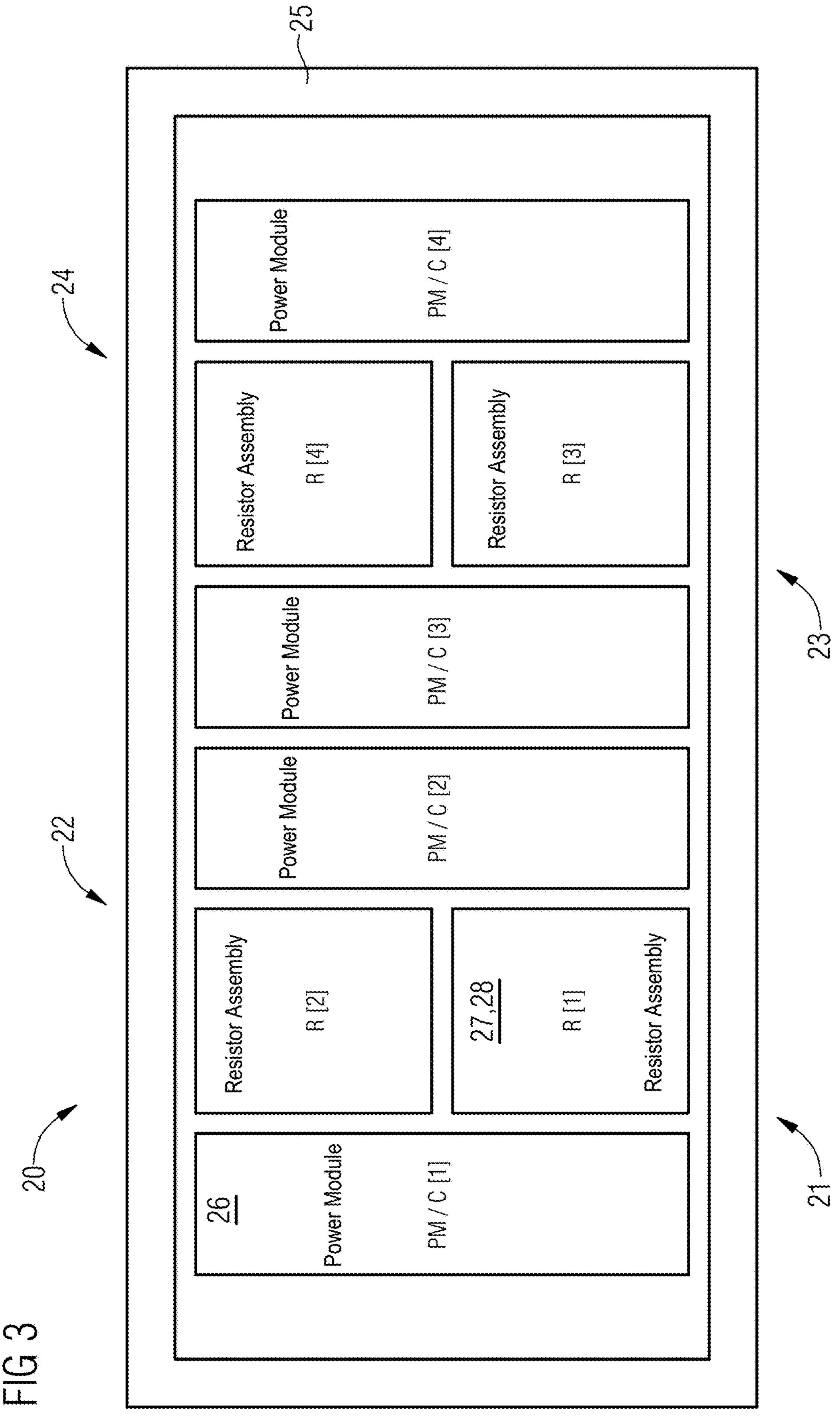
FIG. 3 is a block diagram of a further exemplary embodiment of the device according to the invention.

FIG. 3 illustrates a device 20 for converting electrical energy into heat with four conversion modules 21-24 which are arranged in one level of a carrying structure 25 (FIG. 3 shows a front view of the arrangement). In FIG. 3, the conversion modules 21-24 have an identical design. Their design substantially corresponds to the design of the conversion module 1 of FIG. 2.

Figure 4:
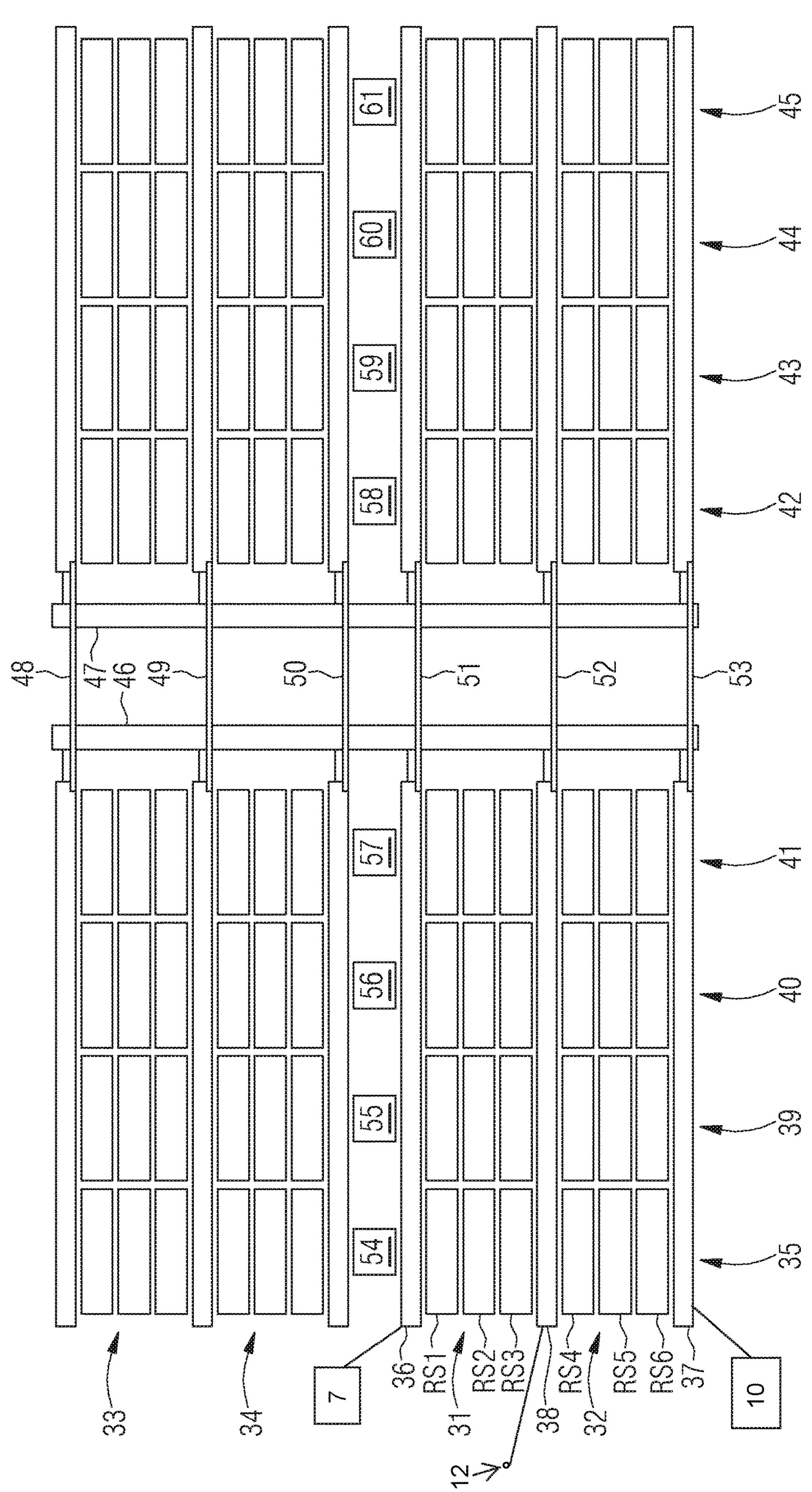
FIG. 4 is a block diagram of an example of resistor assemblies.

The first conversion module 21 contains a so-called power module 26 which contains the semiconductor switches of the conversion module 21 which are accommodated in a separate housing. Furthermore, the first conversion module 21 contains a first and a second resistor assembly 27, 28 which are arranged in their own arrangement alongside the power module 26. It can be seen that the resistor assemblies of two neighboring conversion modules are arranged on top of one another in the carrying structure. FIG. 4 which follows deals with the design of the resistor assemblies themselves in more detail.

FIG. 4 illustrates a first resistor assembly 31, a second resistor assembly 32, a third resistor assembly 33 and a fourth resistor assembly 34 in a side view. The first and the second resistor assembly 31, 32 are assigned to a first conversion module (for example to the first conversion module 21 of FIG. 3). The third and the fourth resistor assembly 33, 34 are assigned to a second conversion module (e.g. to the second conversion module 22 of FIG. 3).

The first resistor assembly 31 contains three resistor disks RS1-3 in a first stack 35. The first stack 35 further contains three resistor disks RS4-6 of the second resistor assembly 32. The resistor disks RS1-6 assigned to the first stack 35 are arranged (and mechanically braced) between a first (upper) cooling plate 36 and a second (lower) cooling plate 37. A middle cooling plate 38 separates the resistor disks R1-3 of the first resistor assembly 31 from the resistor disks RS4-6 of the second resistor assembly 32.

The first and the second resistor assembly 31, 32 contain a further seven stacks 39-45 having resistor disks and which are arranged parallel to the first stack 35 between cooling plates. Front and rear cooling plates are electrically connected to one another by means of busbars 48-53. The cooling plates 36-38 are connected to plastic lines 46, 47 of an active, fluid-based cooling circuit. The sides of the resistor assemblies are closed by means of plates made of glass-fiber-reinforced plastic (not illustrated in FIG. 4). The heat transfers and the cooling system are configured such that the heat dissipation takes place over a period of time of less than 60 minutes until the worst cooled resistor disks have dissipated at least 90%, particularly preferably at least 95%, of the input energy again. The first and the second resistor assembly 31, 32 are separated from the resistor assemblies 33, 34 by means of insulators 54-61.

In relation to the design of a conversion module 1 of FIG. 2, the first cooling plate 36 is electrically connected to the first semiconductor switch 7, the second cooling plate 37 is electrically connected to the second semiconductor switch 10 and the middle cooling plate 38 is electrically connected to the first connection terminal X1 of the conversion module 1 or to a potential point which is denoted by the reference sign 12 in FIG. 2.

Figure 5:
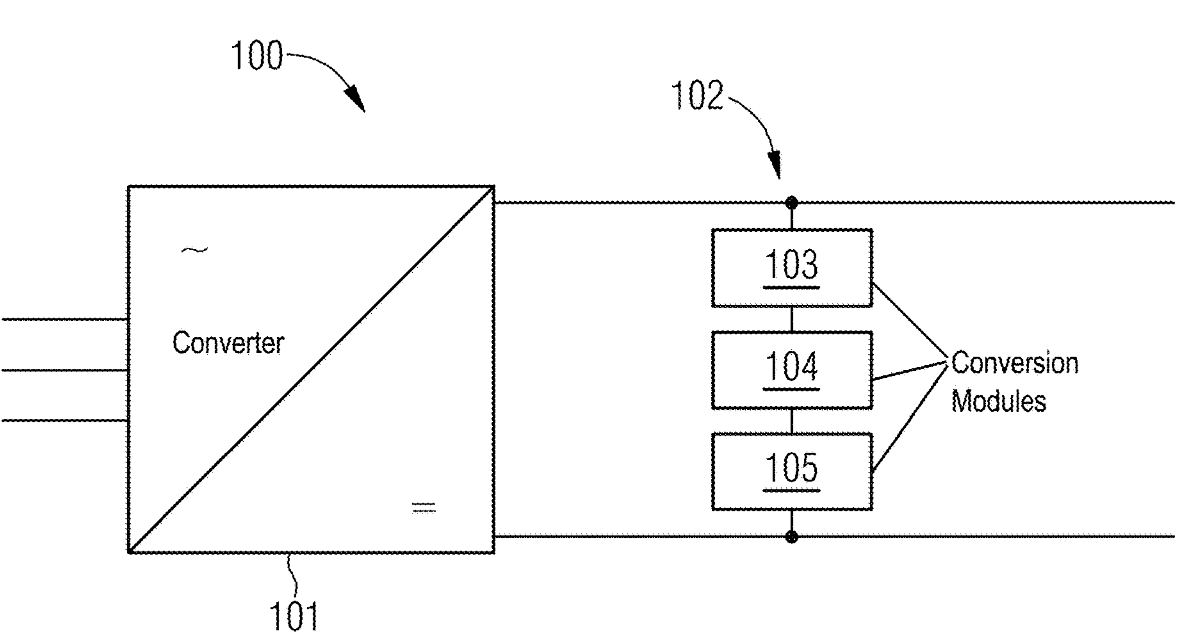
FIG. 5 is a block diagram of an example of a converter arrangement according to the invention.

FIG. 5 illustrates a converter arrangement 100. The converter arrangement contains a converter 101, the AC voltage side of which is able to be connected to an AC voltage grid and the DC voltage side of which is able to be connected to a DC voltage link. A device 102 for converting electrical energy into heat is arranged in parallel with the converter 101 between the two DC voltage poles of the DC voltage link. The device 102 has a series connection of conversion modules 103-105. The conversion modules 103-105 can have an identical design, for example corresponding to the conversion module 1 of FIG. 2 in each case. In the example shown in FIG. 5, the converter 101 converts the AC voltage generated by means of a wind farm (for example at sea) into a DC voltage to be transported and fed into a supply network (for example on land). If the voltage in the DC voltage link increases above a permissible amount (because all of the energy generated in the wind farm cannot be fed into the supply network), some of the electrical energy can thus be converted into heat by means of the device 102. This can contribute toward stabilizing the energy transmission or the networks.

The invention claimed is:

1. The device for converting electrical energy into heat, the device comprising:

cooling plates including a first cooling plate, a second cooling plate and a middle cooling plate; and a first conversion module, containing:

a first connection terminal;

a second connection terminal;

a first resistor assembly connected to said first connection terminal and having a plurality of resistor disks;

a first semiconductor switch being used to block or allow a flow of current through said first resistor assembly and connected to said second connection terminal of said first conversion module;

a second resistor assembly connected to said first connection terminal of said first conversion module and having a plurality of resistor disks;

a second semiconductor switch being used to block or allow a flow of current through said second resistor assembly and connected to said second connection terminal of said first conversion module, wherein said resistor disks of said first and of said second resistor assembly are disposed in a common stack between said first cooling plate and said second cooling plate, said common stack being referred to as a first stack, wherein said first stack further includes said middle cooling plate which separates said resistor disks of said first resistor assembly from said resistor disks of said second resistor assembly, wherein said first cooling plate is electrically connected to said first semiconductor switch, said second cooling plate is electrically connected to said second semiconductor switch and said middle cooling plate is electrically connected to said first connection terminal of said first conversion module; and said first resistor assembly and said second resistor assembly each containing further resistor disks, wherein said further resistor disks of said first and second resistor assemblies are disposed in a common second stack between said first and second cooling plates, wherein said middle cooling plate separates said further resistor disks of said first resistor assembly from said further resistor disks of said second resistor assembly and said second stack is disposed parallel to said first stack.

2. The device according to claim 1, wherein said first conversion module further has a first diode in parallel with said first resistor assembly and a second diode connected in parallel with said second resistor assembly.

3. The device according to claim 1, wherein said resistor disks are each cylindrical ceramic-carbon resistor disks.

4. The device according to claim 1, wherein said first stack and/or said common second stack contain at most ten resistor disks in each case.

5. The device according to claim 1, further comprising a common cooling circuit, said first, second and middle cooling plates are connected to said common cooling circuit.

6. The device according to claim 1, wherein said first and second semiconductor switches are each semiconductor switches which are able to be switched off.

7. The device according to claim 1, wherein said first conversion module further has an energy store which is disposed in a parallel connection with said first semiconductor switch and said first resistor assembly.

8. A converter configuration, comprising:

a converter having an AC voltage side for connecting to an AC voltage grid and a DC voltage side; and said device according to claim 1, said device is connected to said DC voltage side of said converter.

9. The device for converting electrical energy into heat, the device comprising:

cooling plates including a first cooling plate, a second cooling plate and a middle cooling plate;

a first conversion module, containing:

a first connection terminal;

a second connection terminal;

a first resistor assembly connected to said first connection terminal and having a plurality of resistor disks;

a first semiconductor switch being used to block or allow a flow of current through said first resistor assembly and connected to said second connection terminal of said first conversion module;

a second resistor assembly connected to said first connection terminal of said first conversion module and having a plurality of resistor disks; and a second semiconductor switch being used to block or allow a flow of current through said second resistor assembly and connected to said second connection terminal of said first conversion module, wherein said resistor disks of said first and of said second resistor assembly are disposed in a common stack between said first cooling plate and said second cooling plate, said common stack being referred to as a first stack, wherein said first stack further includes said middle cooling plate which separates said resistor disks of said first resistor assembly from said resistor disks of said second resistor assembly, wherein said first cooling plate is electrically connected to said first semiconductor switch, said second cooling plate is electrically connected to said second semiconductor switch and said middle cooling plate is electrically connected to said first connection terminal of said first conversion module;

a carrying structure; and a second conversion module electrically connected in series with said first conversion module, wherein said first conversion module and said second conversion module are disposed in one level of said carrying structure, wherein said second conversion module has a third resistor assembly and a fourth resistor assembly, wherein said third resistor assembly is disposed above and electrically insulated from said first resistor assembly in said carrying structure and said fourth resistor assembly is disposed above and electrically insulated from said second resistor assembly in said carrying structure.

* * * * *